United States Patent
Wu et al.

(10) Patent No.: US 10,157,843 B2
(45) Date of Patent: *Dec. 18, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Yu-Bey Wu, Hsinchu (TW); Dian-Hau Chen, Hsinchu (TW); Jye-Yen Cheng, Taichung (TW); Sheng-Hsuan Wei, Taoyuan (TW); Li-Yu Lee, New Taipei (TW); TaiYang Wu, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/816,843

(22) Filed: Nov. 17, 2017

(65) Prior Publication Data

US 2018/0076141 A1    Mar. 15, 2018

Related U.S. Application Data

(63) Continuation of application No. 15/484,344, filed on Apr. 11, 2017, now Pat. No. 9,852,992, which is a (Continued)

(51) Int. Cl.
*H01L 21/76* (2006.01)
*H01L 23/532* (2006.01)
(Continued)

(52) U.S. Cl.
CPC .... *H01L 23/5329* (2013.01); *H01L 21/31144* (2013.01); *H01L 21/7682* (2013.01);
(Continued)

(58) Field of Classification Search
None
See application file for complete search history.

(56) References Cited

U.S. PATENT DOCUMENTS 6,159,840 A    12/2000  Wang
6,406,992 B1    6/2002  Mao et al.
(Continued)

FOREIGN PATENT DOCUMENTS

KR    20150078100 A    7/2015
KR    20150116516 A    10/2015
(Continued)

OTHER PUBLICATIONS

Notice of Allowance U.S. Appl. No. 15/157,159 dated Jan. 5, 2017.
(Continued)

*Primary Examiner* — Michael Lebentritt
(74) *Attorney, Agent, or Firm* — McDermott Will & Emery LLP

(57) ABSTRACT

In a method for manufacturing a semiconductor device, a first dielectric layer is formed over a substrate, first recesses are formed in the first dielectric layer. Metal wirings extending is a first direction are formed in the first recesses. A mask layer is formed over the metal wirings and the first dielectric layer, which includes a first opening extending in the first direction and is located above a space between adjacent two metal wirings. A first groove corresponding to the first opening is formed between the adjacent two metal wirings by etching the first dielectric layer using the mask layer as an etching mask. A second dielectric layer is formed so that a first air gap is formed in the first groove. A width of the first opening in a perpendicular direction to the first direction is smaller than a space between the adjacent two metal wirings.

20 Claims, 10 Drawing Sheets

Related U.S. Application Data continuation of application No. 15/157,159, filed on May 17, 2016, now Pat. No. 9,653,348.

(60) Provisional application No. 62/273,387, filed on Dec. 30, 2015.

(51) Int. Cl.
  *H01L 21/768* (2006.01)
  *H01L 21/311* (2006.01)
  *H01L 23/522* (2006.01)
  *H01L 23/528* (2006.01)

(52) U.S. Cl.
  CPC .. *H01L 21/76816* (2013.01); *H01L 21/76843* (2013.01); *H01L 23/5222* (2013.01); *H01L 23/5283* (2013.01); *H01L 23/53295* (2013.01); *H01L 21/76832* (2013.01); *H01L 21/76834* (2013.01)

(56) References Cited

U.S. PATENT DOCUMENTS

| | | | |
|---|---|---|---|
| 6,423,630 B1 | 7/2002 | Catabay et al. | |
| 7,301,107 B2 | 11/2007 | Karthikeyan et al. | |
| 9,099,465 B2 | 8/2015 | Zhang | |
| 9,274,920 B2 | 3/2016 | Roovers | |
| 9,653,348 B1 * | 5/2017 | Wu | H01L 21/7682 |
| 9,852,992 B2 * | 12/2017 | Wu | H01L 23/5329 |
| 2004/0087133 A1 | 5/2004 | Kumar | |
| 2004/0097065 A1 | 5/2004 | Lur et al. | |
| 2004/0222533 A1 | 11/2004 | Nakamura et al. | |
| 2004/0256723 A1 | 12/2004 | Akagawa et al. | |
| 2006/0088975 A1 | 4/2006 | Ueda | |
| 2009/0001510 A1 | 1/2009 | Matz et al. | |
| 2009/0001594 A1 | 1/2009 | Yoo et al. | |
| 2009/0093100 A1 | 4/2009 | Xia et al. | |
| 2009/0093112 A1 | 4/2009 | Al-Bayati et al. | |
| 2009/0093132 A1 | 4/2009 | Xu et al. | |
| 2009/0166881 A1 | 7/2009 | Balakrishnan et al. | |
| 2009/0200636 A1 | 8/2009 | Edelstein et al. | |
| 2009/0317975 A1 | 12/2009 | Ding et al. | |
| 2010/0133699 A1 | 6/2010 | Werner et al. | |
| 2010/0301489 A1 | 12/2010 | Seidel et al. | |
| 2011/0104891 A1 | 5/2011 | Al-Bayati et al. | |
| 2011/0108992 A1 | 5/2011 | Chanda et al. | |
| 2013/0075823 A1 | 3/2013 | Yu et al. | |
| 2014/0264896 A1 | 9/2014 | Lu et al. | |
| 2016/0118292 A1 | 4/2016 | He et al. | |
| 2016/0118335 A1 | 4/2016 | Lee et al. | |
| 2016/0181144 A1 | 6/2016 | Nitta et al. | |
| 2016/0181208 A1 | 6/2016 | Bao et al. | |
| 2016/0240428 A1 | 8/2016 | Tung et al. | |
| 2016/0329237 A1 | 11/2016 | Chen et al. | |

FOREIGN PATENT DOCUMENTS

| | | |
|---|---|---|
| TW | 200952117 A | 12/2009 |
| TW | 201338092 A | 9/2013 |
| TW | 201351566 A | 12/2013 |
| TW | 201417188 A | 5/2014 |
| TW | 201426907 A | 7/2014 |
| TW | 201505180 A | 2/2015 |

OTHER PUBLICATIONS

Office Action German Patent Application No. 10 2016 117 486.6 dated Oct. 24, 2016 with partial English translation.
Office Action Taiwanese Patent Application No. 105127215 dated Jan. 9, 2017.
Notice of Allowance issued in U.S. Appl. No. 15/484,344, dated Nov. 15, 2017.
Korean Office Action issued in corresponding Korean Application No. 10-2016-0136350, dated Mar. 8, 2018.

* cited by examiner

SEMICONDUCTOR DEVICE AND MANUFACTURING METHOD THEREOF

RELATED APPLICATIONS

This application is a Continuation Application of U.S. Ser. No. 15/484,344, filed Apr. 11, 2017, now U.S. Pat. No. 9,852,992, which is a Continuation Application of U.S. Ser. No. 15/157,159, filed May 17, 2016, now U.S. Pat. No. 9,653,348, which claims priority to U.S. Provisional Application No. 62/273,387 filed on Dec. 30, 2015, the entire contents of which applications are incorporated herein by reference.

TECHNICAL FIELD

The disclosure relates to a semiconductor integrated circuit, more particularly to a semiconductor device having air gaps between metal wirings and its manufacturing process.

BACKGROUND

As the semiconductor industry introduces new generations of integrated circuits (ICs) having higher performance and greater functionality, the density of the elements that form the ICs is increased, while the dimensions and spacing between components or elements of the ICs are reduced, which causes a variety of problems. For example, for any two adjacent conductive features, when the distance between the conductive features decreases, the resulting capacitance (parasitic capacitance) increases. The increased capacitance results in an increase of power consumption and an increase in the resistive-capacitive (RC) time constant, i.e., an increase of signal delays. The capacitance between two adjacent conductive features (e.g., metal wirings) is a function of the dielectric constant (k value) of an insulating material filled in the space between the conductive features (also, a function of a distance between the conductive features and a size of the side surfaces of the conductive features). Therefore, the continual improvement in semiconductor IC performance and functionality is dependent upon developing insulating (dielectric) materials with low k values. Since the substance with the lowest dielectric constant is air (k=1.0), air-gaps are formed to further reduce the effective k value of metal wiring layers.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1-11 show exemplary sequential processes for manufacturing a semiconductor device having air gaps according to one embodiment of the present disclosure. FIGS. 1-11 illustrate exemplary sequential processes for fabricating one of metal wiring layers (wiring levels), which are formed above a substrate. Although there are core structures such as transistors or other elements (e.g., contacts etc.) constituting the semiconductor device (hereinafter referred to as "underlying structures") between the substrate and the metal wiring layers, detailed illustrations of such elements are omitted in FIGS. 1-11 for simplicity. The order of the processes may be changed. FIGS. 1-3, 5A, 6A, . . . 10A and 11 show exemplary cross sectional views and FIGS. 5B, 6B, . . . 10B show exemplary plan views (top views).

Figure 1:
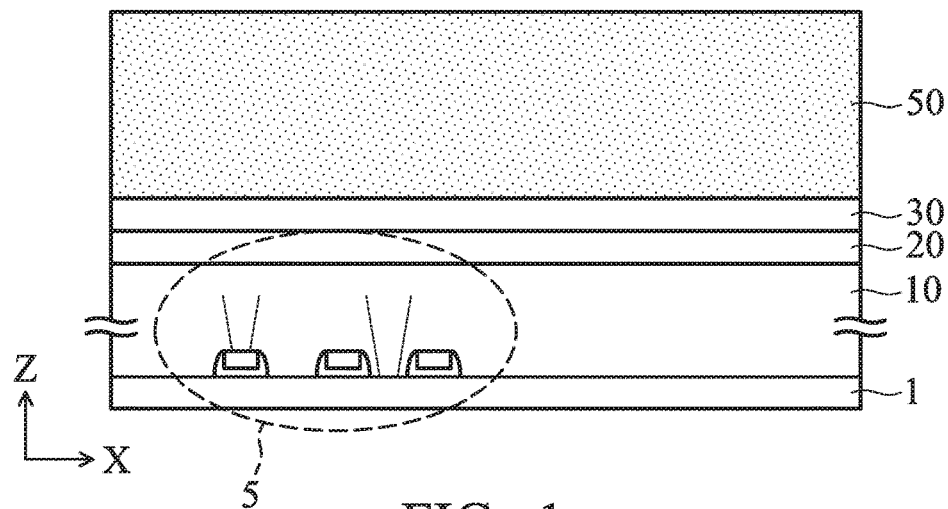
FIGS. 1-11 show exemplary sequential processes for manufacturing a semiconductor device having air gaps according to one embodiment of the present disclosure.

As shown in FIG. 1, a first interlayer dielectric (ILD) layer 10 is formed over the underlying structures 5 disposed over the substrate 1. An interlayer dielectric layer may also be called an inter-metal dielectric (IMD) layer. The first ILD layer 10 is made of, for example, one or more layers of low-k dielectric material. Low-k dielectric materials have a k-value (dielectric constant) lower than about 4.0. Some low-k dielectric materials have a k-value lower than about 3.5 and other low-k dielectric material may have a k-value lower than about 2.5.

The materials for the first ILD layer 10 include compounds comprising elements of Si, O, C and/or H, such as SiCOH and SiOC. Organic materials, such as polymers, may be used for the first ILD layer 10. For example, the first ILD layer 10 is made of one or more layers of a carbon-containing material, organo-silicate glass, a porogen-containing material, and/or combinations thereof. Nitrogen may also be included in the first ILD layer 10 in some embodiments. The first ILD layer 10 may be a porous layer. The density of the first ILD layer 10 is less than about 3 g/cm$^3$ in one embodiment and may be less than about 2.5 g/cm$^3$ in other embodiments. The first ILD layer 10 may be formed by using, for example, plasma-enhanced chemical vapor deposition (PECVD), low pressure CVD (LPCVD), atomic layer CVD (ALCVD), and/or a spin-on technology. In case of PECVD, the film is deposited at a substrate temperature in a range of about 25° C. to about 400° C. and at a pressure of less than 100 Torr.

In some embodiments, the first ILD layer includes an inter-layer insulating film and an inter-wire insulating film such that the metal wirings will be formed mainly in the inter-metal insulating film. The inter-layer insulating film may include a SiOC film and the inter-wire insulating film may include a TEOS (tetraethylorthosilicate) film.

In some embodiments, an under-layer etch-stop layer (ESL) 20 is formed over the first ILD layer 10, and an under-layer cap layer 30 is formed over the under-layer ESL 20. The under-layer ESL 20 includes one or more layers of SiN, SiCO, SiON, SiCN, and SiCON. The under-layer cap layer 30 includes one or more layers of a silicon oxide based material, such $SiO_2$, TEOS and SiON in some embodiments.

Further, a second ILD layer 50 is formed over the first ILD layer 10 or the under-layer cap layer 30, if under-layer cap layer 30 is used. The material for the second ILD layer 50 is selected from the exemplary materials for the first ILD layer 10 as set forth above.

Figure 2:
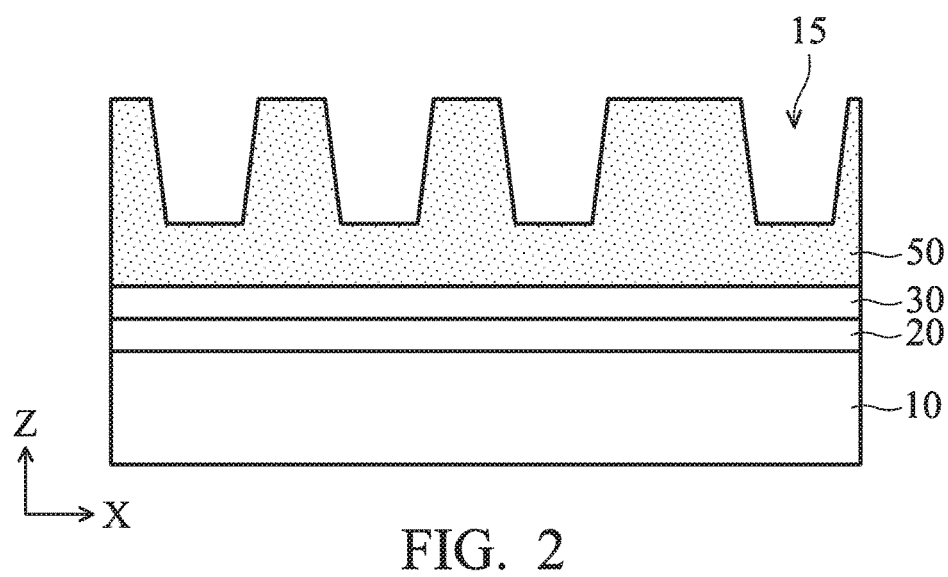

As shown in FIG. 2, first recesses 15 are formed in the second ILD layer 50 by using patterning operations including lithography and etching processes. In some embodiments, one or more via holes (contact holes) (not shown) to be connected to one or more elements of the underlying structures are formed at the bottom of the first recesses.

Figure 3:
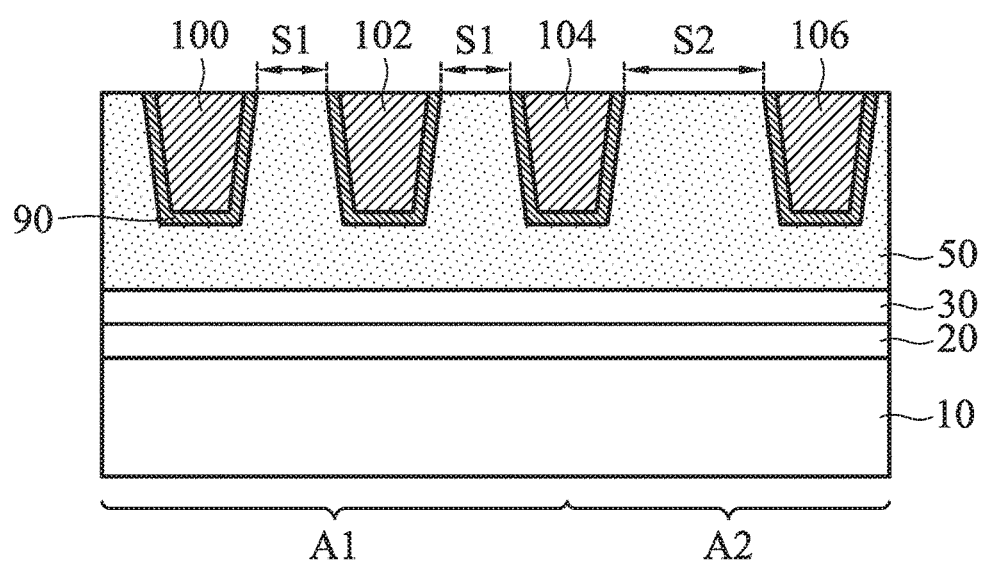

As shown in FIG. 3, a metal material is formed in the first recesses to form metal wirings 100, 102, 104 and 106. The operations to form the metal wirings include a damascene process. In the damascene process, one or more layers of metal material are formed in the first recesses 15 and the upper surface of the second ILD layer 50, and a planarization operation such as a chemical mechanical polishing method and/or a etch-back method is performed to remove portions of the metal material formed on the upper surface of the second ILD layer 50.

As shown in FIG. 3, the semiconductor device of the present embodiment includes a dense wiring region A1 and a coarse wiring region A2. In the dense wiring region A1, the metal wirings 100, 102 and 104 are arranged with a space S1, and in the coarse wiring region A2, the metal wirings 104 and 106 are arranged with a space S2, where S2>S1. In FIG. 3, the wiring 104 belongs to the dense wiring region A1 and the coarse wiring region A2 for the purpose this disclosure. In other embodiments, the dense wiring region A1 and the coarse wiring region A2 are not adjacent to each other and do not share the same wiring. The metal wiring 106 in the coarse wiring region A2 may be a dummy metal wiring, which is not a part of a functioning circuit. In FIG. 3, the metal wirings extend in the Y direction.

In one embodiment, the space S1 is the minimum space Smin for the metal wirings in this layer, which is defined by the design rule. In other words, no two metal wirings in the same wiring layer are arranged with a space smaller than Smin within one semiconductor device. Generally one minimum space Smin value for one metal wiring layer is defined within one semiconductor device, and the value of Smin may be different in other wiring layers or in other devices.

In some embodiments, S1 is in a range from about 10 nm to about 38 nm. Further, in the dense wiring region A1, the line width W1 of the metal wirings is substantially the same as S1, in some embodiments. In other embodiments, the dense wiring region A1 is defined as a region in which metal wirings are arranged with S1, where Smin≤S1<αSmin (1<α<3, for example, 1.2, 1.5, 2.0, 2.5, etc). Air gaps are subsequently formed in the dense wiring region A1.

In contrast, in the coarse wiring region A2, the space S2 between adjacent metal wirings is set larger than S1. The space S2 varies in the semiconductor device depending on, for example, the locations and the functions of the metal wirings. In one embodiment, the space S2 is simply greater than S1. In certain embodiments, when S1=Smin, S2 is greater than Smin, and when Smin≤S1<αSmin, S2 is equal to or greater than αSmin. In other embodiments, Smin≤S1≤αSmin and S1<S2.

The one or more layers of metal material for the metal wirings 100, 102, 104 and 106 are formed by CVD, physical vapor deposition (PVD) including sputtering and/or electroplating.

The metal material for the metal wirings is one or more layers of Al, Cu, Co, Mn, W, Ti, Ta, TiN, TaN, TiW, WN, TiAl, TiAlN, TaC, TaCN and TiSiN. For example, the metal wirings may include a barrier layer 90 made of, for example, TiN and/or TaN, and a body layer (100, 102, 204 and 106) made of, for example, Cu or Cu-based materials. The metal wiring structure may be made by a damascene process.

Figure 4A:
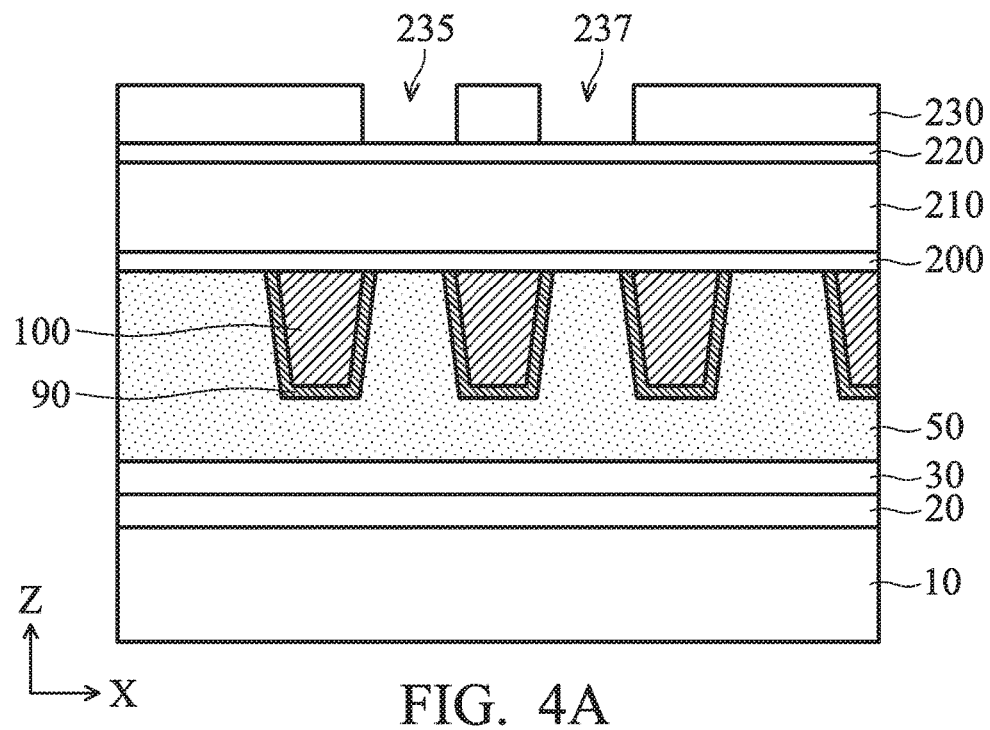

After forming the metal wirings 100, 102, 104 and 106, a first etch-stop layer (ESL) 200 is formed over the metal wirings and the second ILD layer 50, as shown in FIG. 4A. The first ESL 200 functions as an etching mask layer in a subsequent etching of the second ILD layer 50. The first ESL 200 includes one or more layers of a Si-based insulating material containing Si with O, N, C, B and or H, or an Al-based insulating material containing Al with O, N, C, B and or H. Examples of the second etch-stop layer include SiN, SiCO, SiCN and SiCON. In one embodiment, SiN is used.

The thickness of the first ESL 200 is in a range of about 1 nm to about 30 nm in some embodiments, and is in a range of about 5 nm to about 15 nm in other embodiments. The density of the first ESL 200 is less than about 3 $g/cm^3$ in one embodiment and may be less than about 2.5 $g/cm^3$ in other embodiments.

The first ESL 200 may be formed by using, for example, PECVD, LPCVD, ALCVD, and/or a spin-on technology. In case of PECVD, the first ESL 200 is deposited at a substrate temperature in a range of about 25° C. to about 400° C. and at a pressure of less than 100 Torr.

After the formation of the first ESL 200, a first mask layer 210 is formed on the first ESL 200, and a second mask layer 220 is formed on the first mask layer 210, as shown in FIG. 4A. The first mask layer 210 is made of, for example, an organic material, such as a material used as a bottom anti-reflection coating (BARC). The second mask layer 220 is made of a material having a high degree of etching selectivity to the first mask layer 210, and is made of an organic material with a high Si content different from the first mask layer 210. The content of Si in the organic material is about 30 weight % or more. The thickness of the first mask layer 210 is in a range of about 50 nm to about 200 nm in some embodiments, and the thickness of the second mask layer 220 is in a range of about 20 nm to about 50 nm in some embodiments.

Figure 4B:
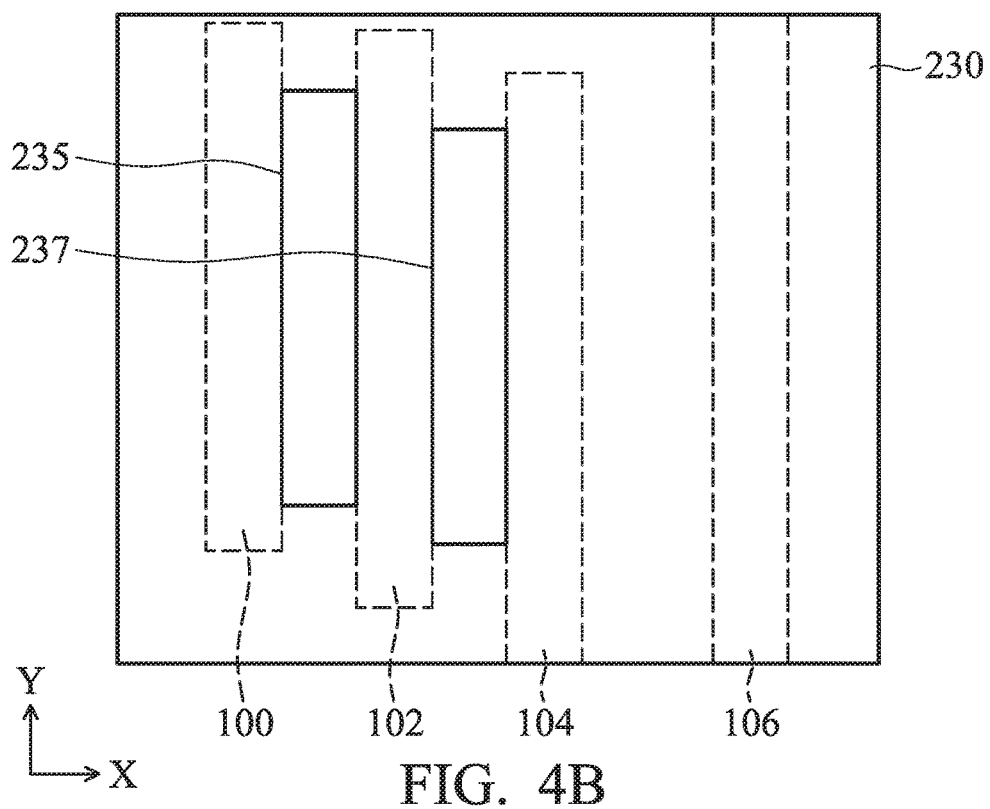

Further, as shown in FIG. 4A, a photo resist pattern 230 having a first opening 235 and a second opening 237 is formed on the stacked layers of the first ESL 200, the first mask layer 210 and the second mask layer 220. Edges of the longer sides (along the Y direction) of the openings 235 and 227 are located over the upper surfaces of or the edges of the adjacent metal wirings in plan view, as shown in FIG. 4B. In other words, the first opening 235 is partially overlapped with at least one of the metal wirings 100 and 102.

Figure 5A:
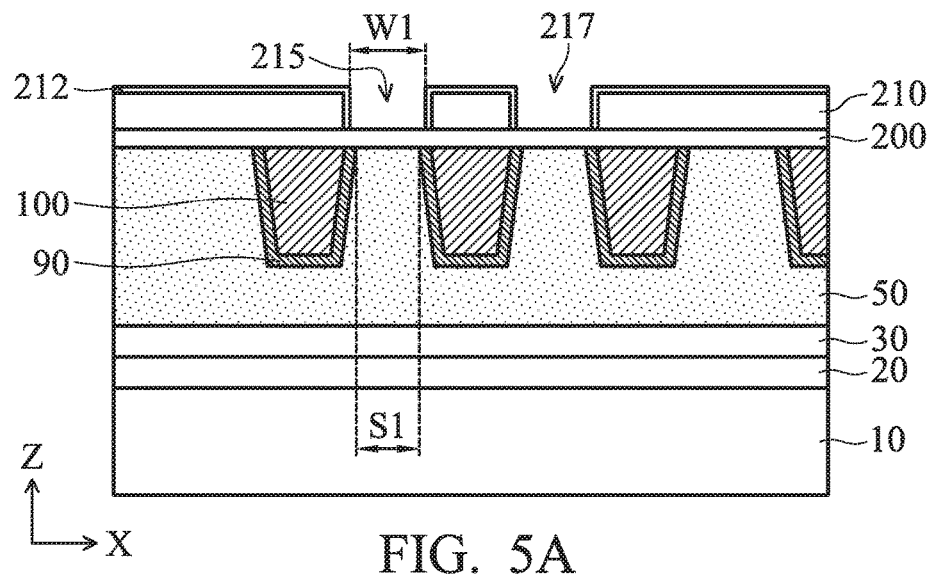
Figure 5B:
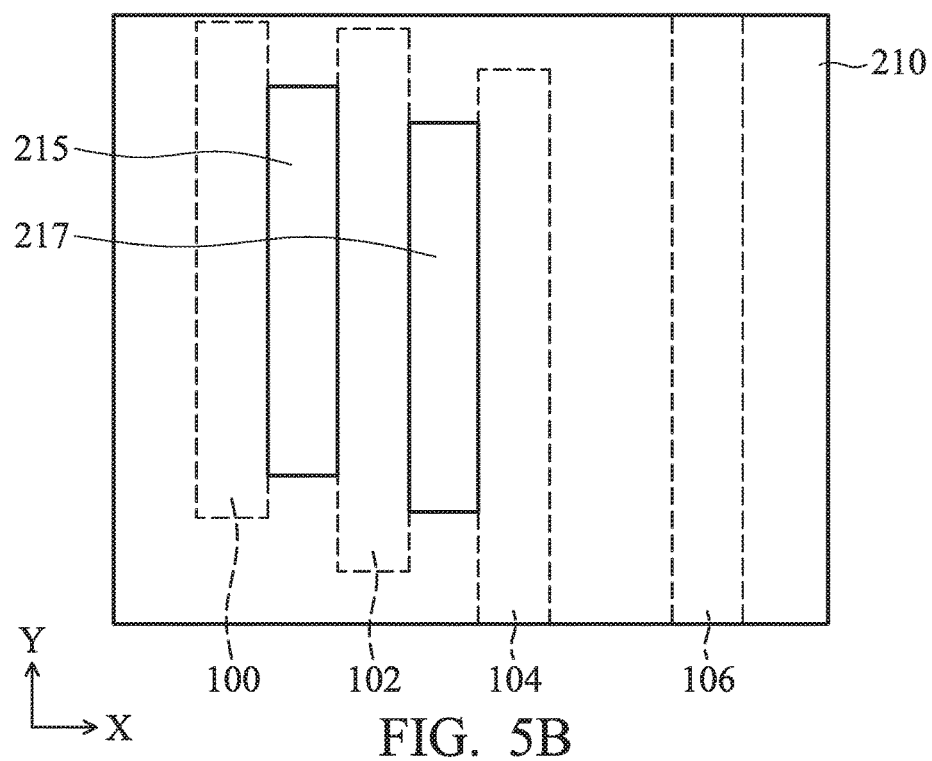

By using the photo resist pattern 230 as an etching mask, the second mask layer 220 is patterned, and subsequently, the first mask layer 210 is patterned. In the patterning the first mask layer, the photo resist pattern 230 is used as an etching mask, or the patterned second mask layer 220 is used as an etching mask after the photo resist pattern is removed. After the photo resist pattern and the second mask layer are removed, the first mask layer having a first opening 215 and a second opening 217 as shown in FIGS. 5A and 5B is obtained. As shown in FIG. 5A, a crosslinked layer 212 of organic material is formed on the patterned first mask layer 210, in some embodiments. Depending on the materials of the first and second mask layers, the crosslinked layer may not be formed.

After the patterning of the first mask layer 210, the width W1 in the X direction of the first and second openings 215, 217 is equal to or greater than a space S1 of the adjacent two metal wirings (at the upper surface) e.g., wirings 100 and 102, or wirings 102 and 104. Edges of the longer sides (along the Y direction) of the openings 215 and 217 are located over the upper surfaces of or the edges of the adjacent metal wirings in plan view, as shown in FIG. 5B. In other words, the first opening 215 is partially overlapped with at least one of the metal wirings 100 and 102. When the space width between adjacent two metal wirings is S and the line width of the metal wirings is L, the width of the openings is less than about S+L, where the center of the openings is located above the space between adjacent two metal wirings, so that the first opening 215 and the second opening 217 are separated.

Figure 6A:
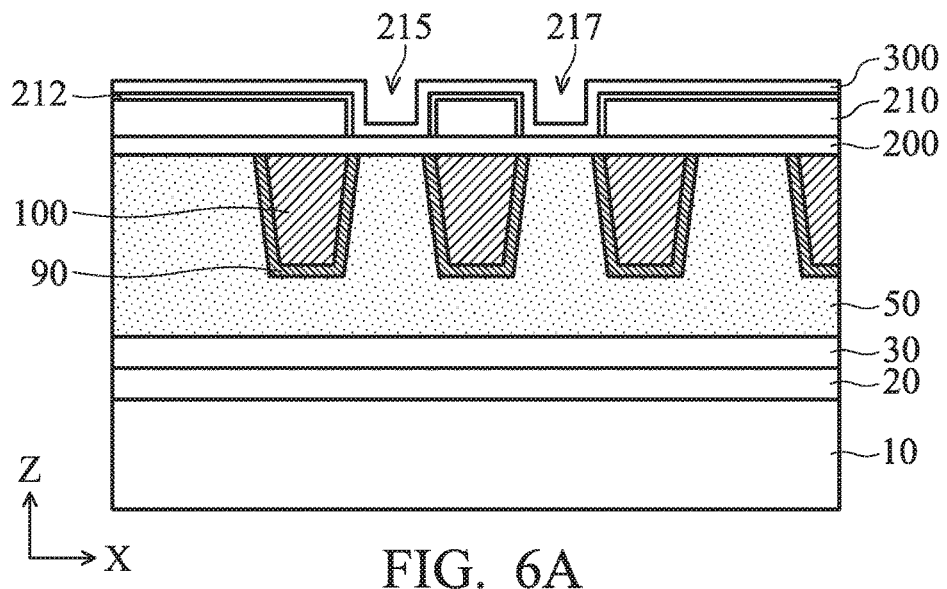
Figure 6B:
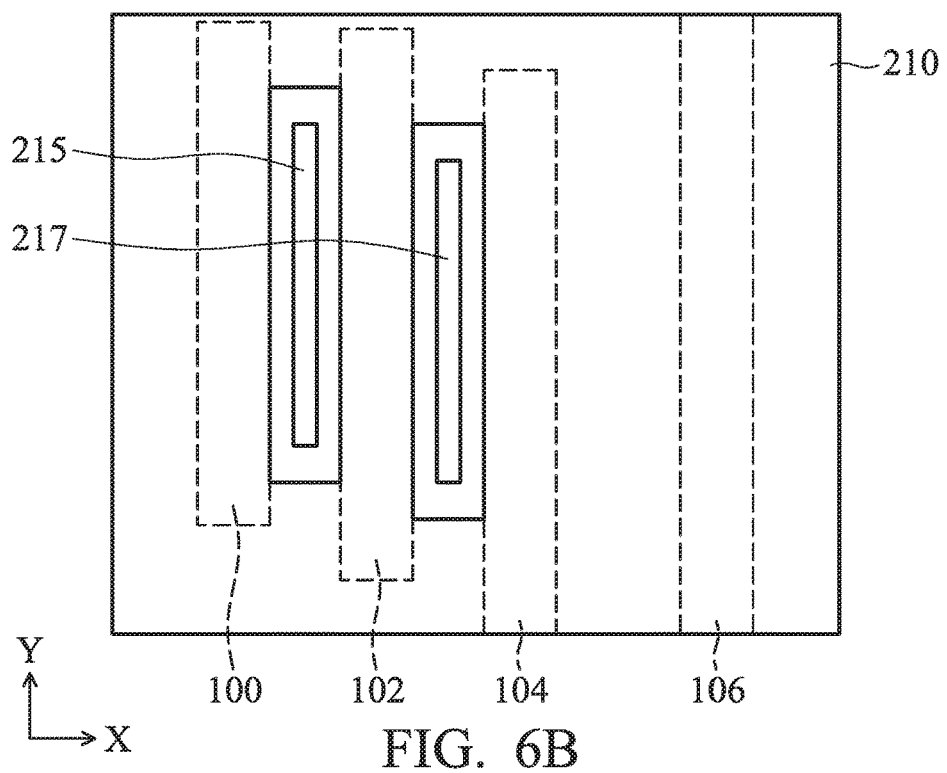

Subsequently, an operation to reduce the width of the first opening 215 and the second opening 217 is performed. As shown in FIGS. 6A and 6B, a blanket spacer layer 300 is formed over the structure of FIGS. 5A and 5B. The blanket spacer layer 300 includes an oxide material, such as $TiO_2$ or $ZrO_2$, or a nitride material, such as TiN or TaN. In this embodiment, $TiO_2$ is used as the blanket spacer layer 300. The thickness of the blanket spacer layer 300 is in a range from about 3 nm to about 10 nm in some embodiments.

Figure 7A:
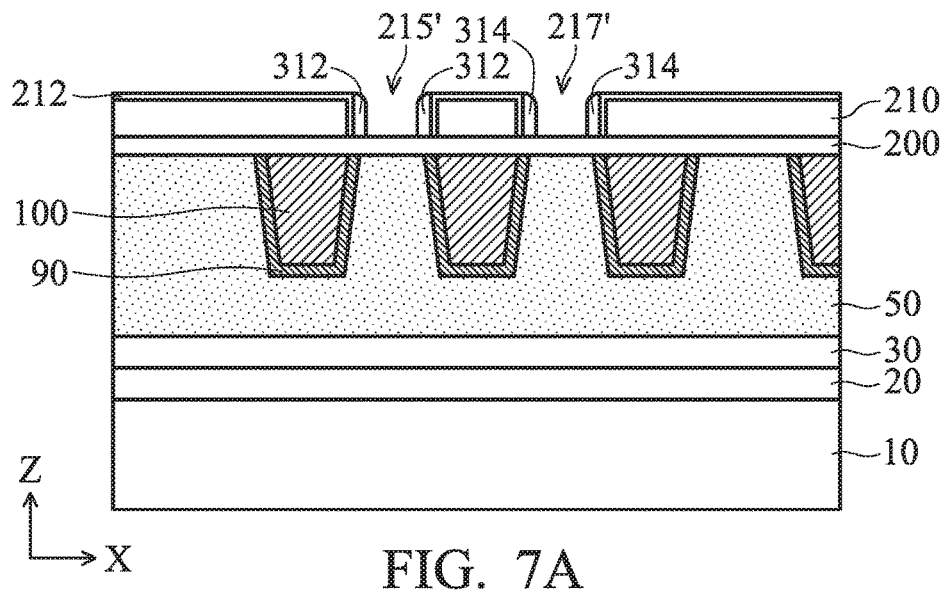
Figure 7B:
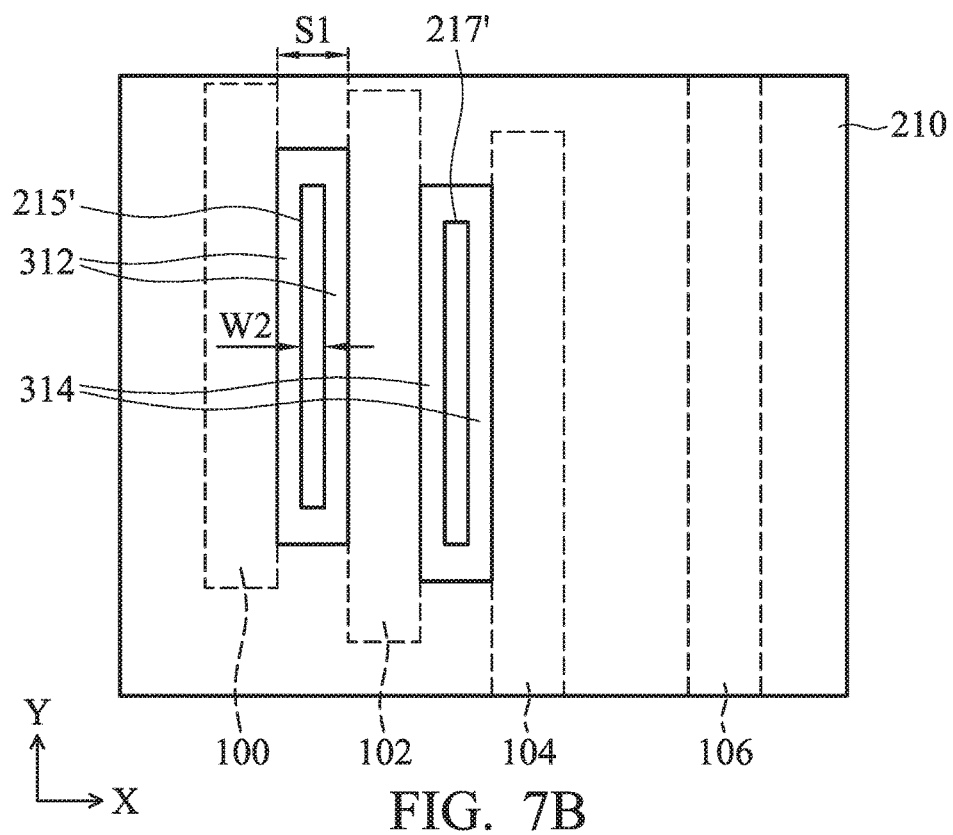

An anisotropic etching is performed on the blanket spacer layer 300, thereby forming a first sidewall spacer 312 on a sidewall of the first opening 215 and a second sidewall spacer 314 on a sidewall of the second opening 217, so that a second mask pattern having a reduced first opening 215' defined by the first sidewall spacer 312 and a reduced second opening 217' defined by the second sidewall spacer 314 are obtained, as shown in FIGS. 7A and 7B.

The width W2 of the reduced first opening 215' is smaller than the space Si between the adjacent two metal wirings, and is in a range from about 5 nm to about 10 nm in some embodiments. Further, the reduced first opening 215' does not overlap the underlying metal wirings 100 and 102, in plan view. The configuration of the reduced second opening 217' is substantially the same as that of the reduced first opening 215'.

In some embodiments, a resist pattern having the reduced width W2 as the second mask pattern is formed on the first ESL 200 by using a high-resolution lithography tool, such as an e-beam lithography system or an EUV or X-ray lithography system.

Figure 8A:
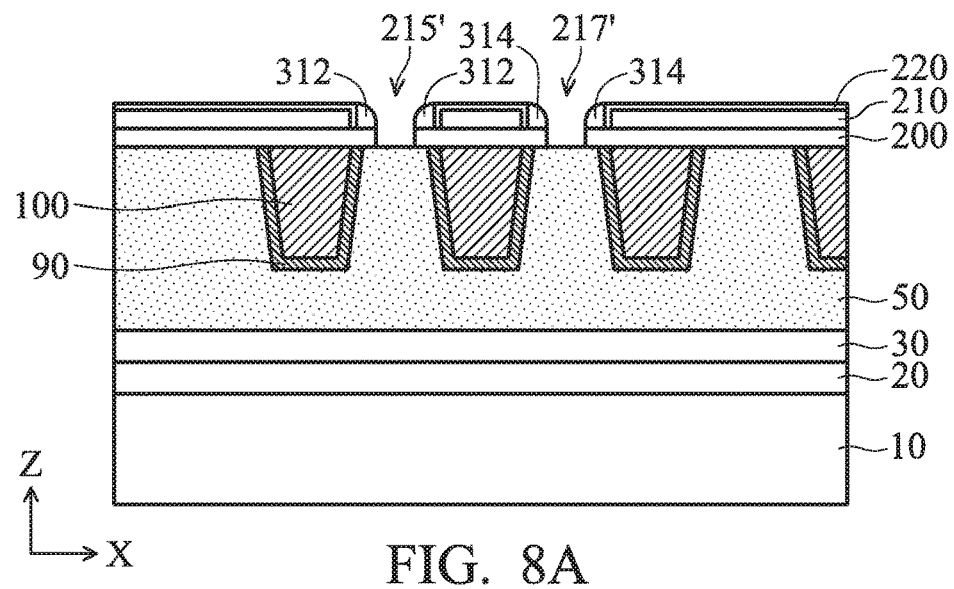
Figure 8B:
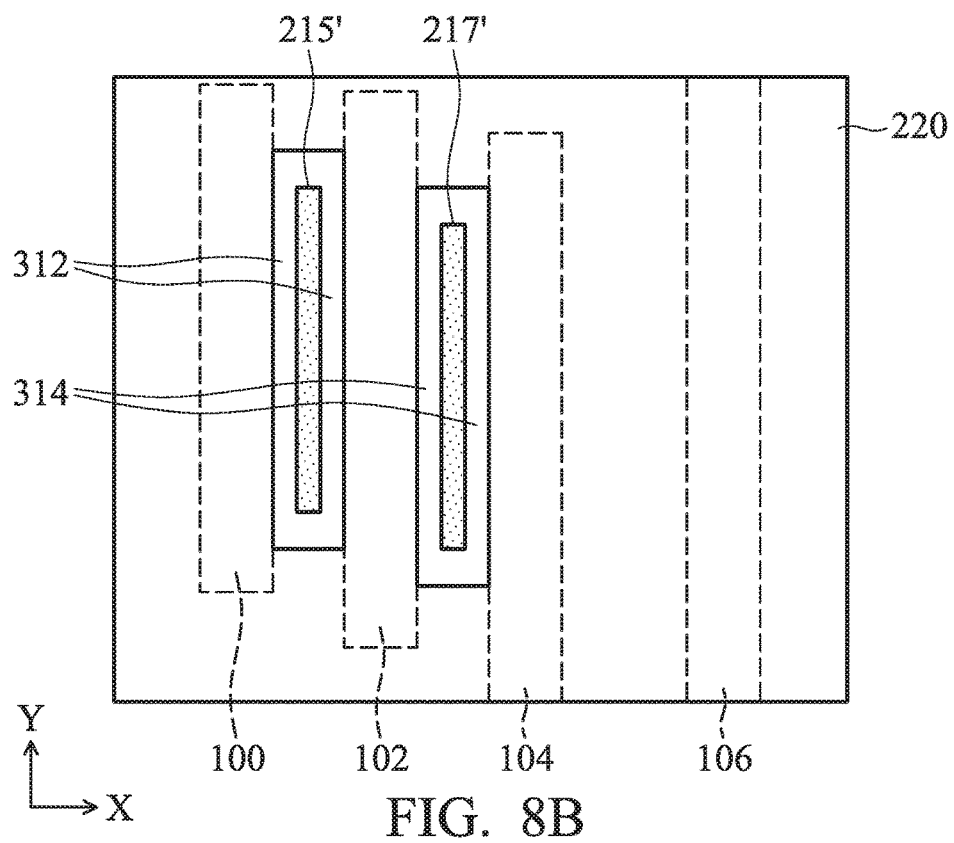

As shown in FIGS. 8A and 8B, the first ESL 200 is patterned by an etching operation using the second mask as an etching mask, thereby forming openings 215" and 217" in the first ESL 200, corresponding to the first reduced opening 215' and the second reduced opening 217', respectively. The width of the openings 215" and 217" is substantially the same as the width of the first reduced opening 215' and the second reduced opening 217'. By this etching a part of the upper surface of the second ILD 200 is exposed at the bottoms of openings 215" and 217".

Figure 9A:
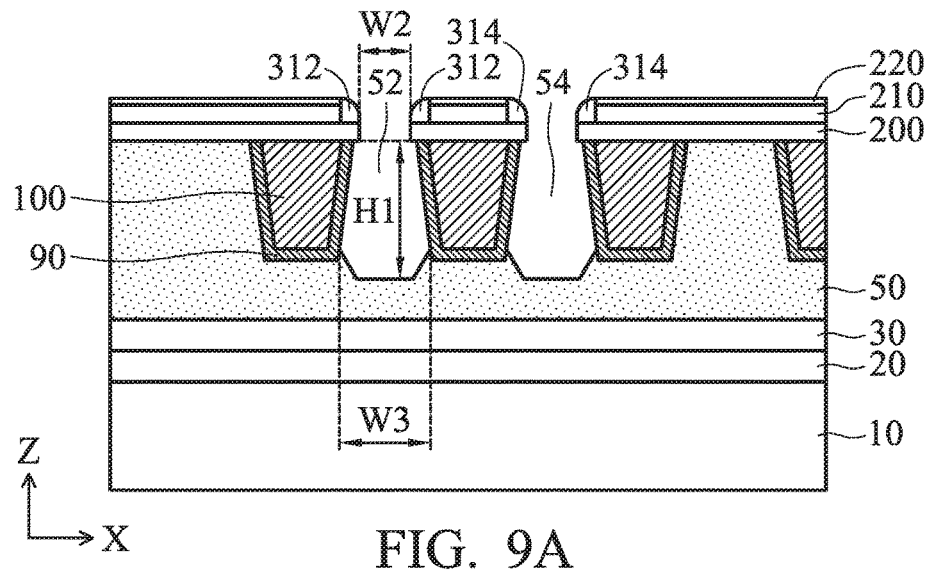

As shown in FIGS. 9A an 9B, a first groove 52 corresponding to the opening 215" and a second groove 54 corresponding to the opening 217" are formed between adjacent two metal wirings (100 and 102, 102 and 104) by etching the second ILD 50 through the openings 215" and 217".

Figure 9B:
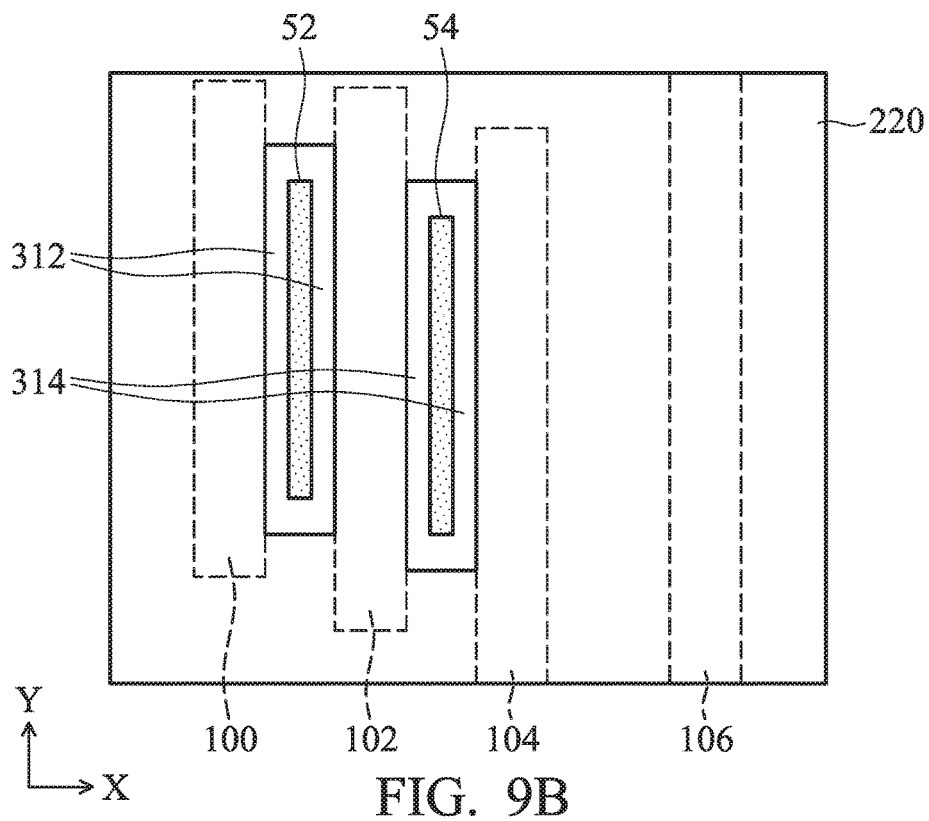

In one embodiment, the stack of the patterned first ESL 200 and first mask layer 210 with sidewall spacers is used as an etching mask, as shown in FIGS. 9A and 9B. The etching of the second ILD 50 includes a dry etching and/or a wet etching, followed by a wet cleaning process. In some embodiments, the first mask layer 210 with sidewall spacers is removed and only the patterned first ESL 200 is used as an etching mask in other embodiments. The maximum width W3 of the first groove 52 in the X direction is in a range from about 15 nm to about 20 nm in some embodiments. The depth H1 of the first groove 52 in the Z direction is in a range from about 70 nm to about 120 nm in some embodiments. The bottom of the first groove 52 may be located below the bottom of the metal wirings. The second groove 54 has substantially the same configuration as the first groove 52.

Figure 10A:
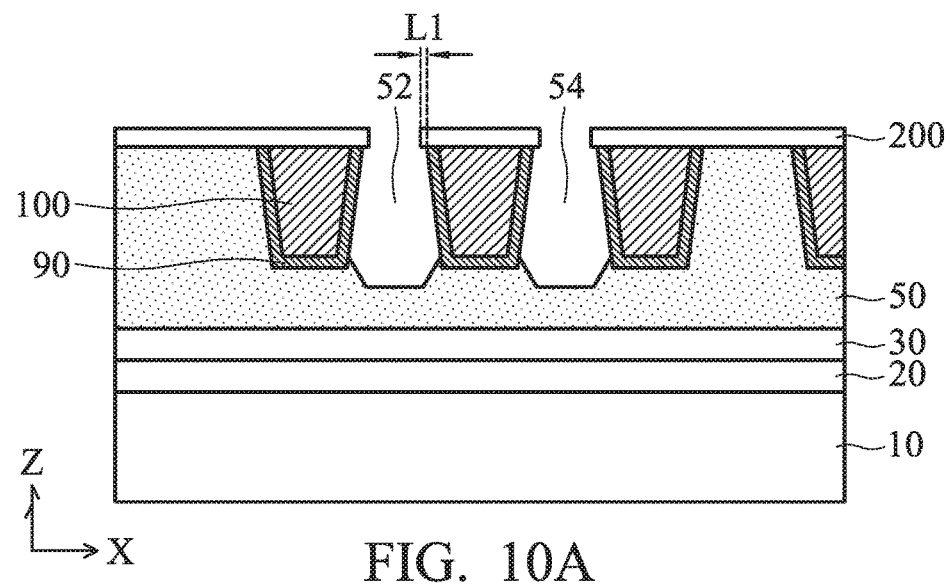
Figure 10B:
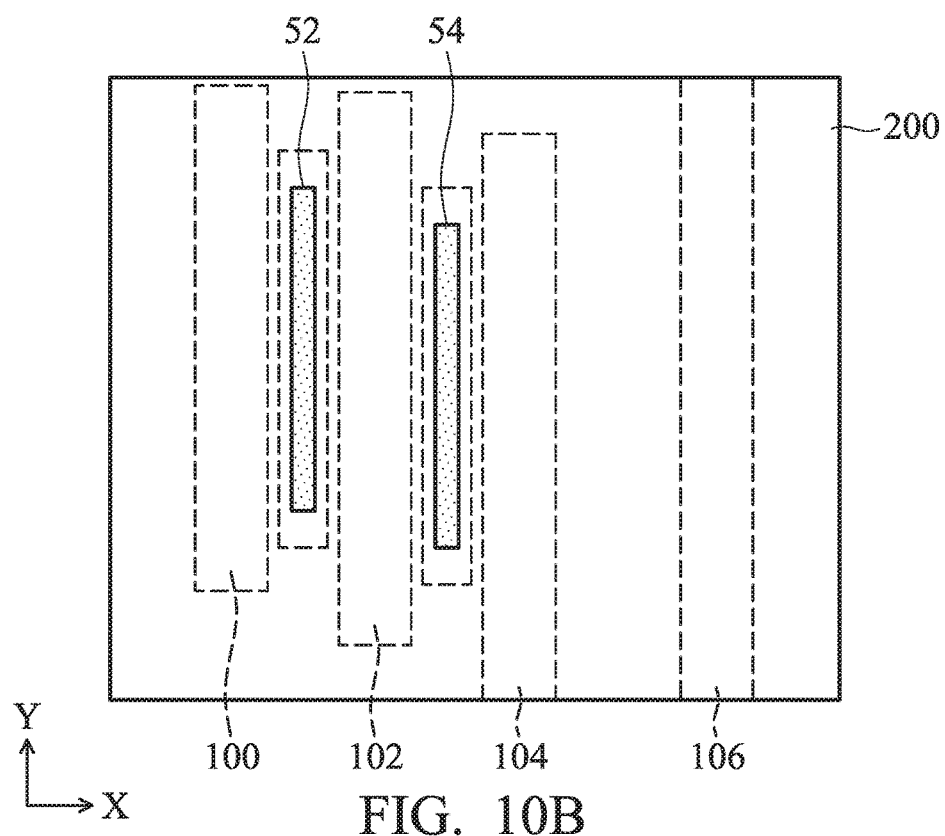

After the second ILD 50 is etched to form the first and second grooves, the first mask layer 210 with the sidewall spacers is removed, as shown in FIGS. 10A and 10B.

As shown in FIGS. 10A and 10B, upper surfaces of two metal wirings 100 and 102 adjacent to the first groove 52 are covered by the mask layer and are not exposed. Similarly, upper surfaces of two metal wirings 102 and 104 adjacent to the first groove 54 are covered by the mask layer and are not exposed. The first ESL 200 includes a portion overhanging the first groove 52 and a portion overhanging the second groove 54. The amount of the overhanging L1 is in a range from about 0.5 nm to about 2 nm in some embodiments.

After the grooves are formed and the first mask layer 210 with the sidewall spacers is removed, a dielectric layer for forming air gaps 56, 58 is formed in and over the grooves. The dielectric layer includes two or more layers of dielectric material.

Figure 11:
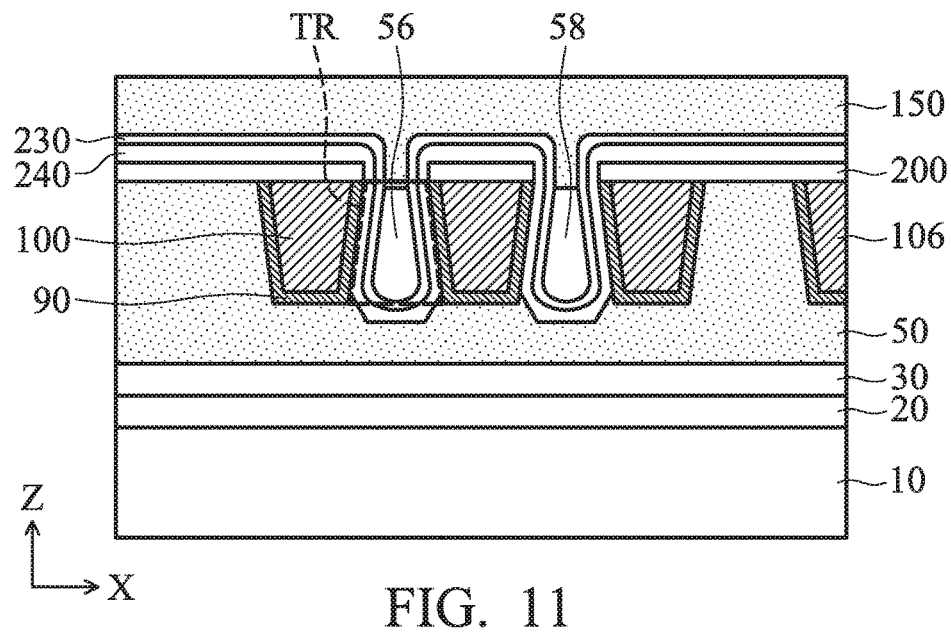

In some embodiments, as shown in FIG. 11, the dielectric layer includes a second ESL 240, a cap layer 230 and a third ILD 150. The second ESL 240 is conformally formed on inner surface of the first and second grooves 52, 54. In some embodiments, the cap layer 230 is also conformally formed on the second ESL 240. The third ILD 150 is not substantially formed in the grooves as the cap layer 230 makes the upper opening of the groove very small. Thus, a part of the cap layer 230 in the first and second grooves is not covered by the third ILD 150. In some embodiments, the cap layer 230 completely closes the upper openings of the grooves.

As shown in FIG. 11, the thickness of the second ESL 240 formed in the grooves is smaller than the thickness of the second ESL formed over the first ESL 220. Similarly, the thickness of the cap layer 230 formed in the grooves is smaller than the thickness of the cap layer formed above the first ESL 220. Accordingly, it is possible to make the volume of the air gaps 56, 58 large. In some embodiments, the air gap 56 replaces more than ⅔ of the volume of the area between adjacent two metal wirings. In the cross sectional view of FIG. 11, the air gap area of air gap 56 is more than ⅔ of the trapezoid area TR between metal wirings 100 and 102.

The second ESL 240 includes one or more layers of SiN, SiCO, SiCN and SiCON. In one embodiment, SiN is used. The thickness of the second ESL 240 is in a range from about 5 nm to about 15 nm in some embodiments. The cap layer 230 includes one or more layers of a silicon oxide based material, such $SiO_2$, TEOS and SiON. In one embodiment, TEOS is used. The thickness of the cap layer 230 is in a range from about 5 nm to about 15 nm in some embodiments.

To form air gaps by the third ILD layer 150, a non-conformal CVD method with a low step coverage condition may be utilized. By using non-conformal CVD, the deposited third ILD at the openings of the grooves "pinch-off" (is connected) before the grooves are filled with the insulating material of the third ILD layer, thereby forming air gaps in the grooves.

The third ILD layer 150 may include one or more layers of silicon oxide, silicon oxynitride (SiON), SiCN, SiOC or SiOCN, or low-k material. The third ILD layer 150 may be doped with, for example, phosphorous, to enhance its void formation effects.

Figure 12:
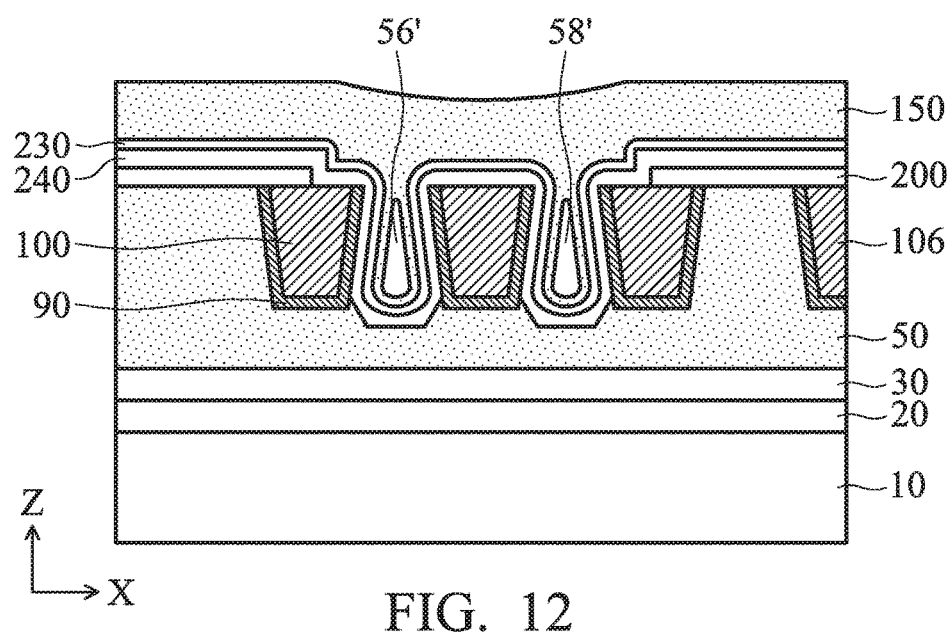
FIG. 12 shows a comparative example of a semiconductor device having air gaps.

FIG. 12 shows a comparative example, in which a mask pattern (corresponding to the second mask pattern for etching the second ILD) having a wider opening that covers two spaces formed by three wiring patterns is used. In the comparative example, when the second ILD 50 is etched, at last part of the upper surface of the metal wirings 100, 102 and 104 are exposed and etched, thereby forming rounded corner shapes. The residue of the etched metal (e.g., Cu) from the metal wirings may remain in the grooves, which may require an additional cleaning operation. Further, it may be necessary to compensate for the etched metal wirings by depositing an additional metal material (e.g., Co) to prevent erosion of the upper surface of the metal wirings. Further, the region where the air gaps are formed has a low-height topography, compared with the other regions where no air gap is formed.

In contrast, in the present embodiments, since the upper surfaces of the metal wirings are protected by the first ESL 200, the upper corners of the metal wirings can maintain an acute angle and no rounding is observed. Further, the stacked layers of the first ESL 200, the second ESL 240 and the cap layer 230 are disposed over the metal wirings, it is possible to maintain the same height after a planarization operation (e.g., a chemical mechanical polishing) of the third ILD. Moreover, the first ESL formed on the metal wiring (e.g., Cu) can prevent erosion of the Cu layer. In addition, because a lower amount of the cap layer (and the third ILD) is filled in the groove, it is possible to increase the volume of the air gaps.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, a first dielectric layer is formed over a substrate. First recesses are formed in the first dielectric layer. Metal wirings are formed in the first recesses. The metal wirings extend in a first direction. A mask layer is formed over the metal wirings and the first dielectric layer. The mask layer includes a first opening extending in the first direction, and is located above a space between adjacent two metal wirings. A first groove corresponding to the first opening is formed between the adjacent two metal wirings by etching the first dielectric layer using the mask layer as an etching mask. A second dielectric layer is formed so that a first air gap is formed in the first groove. A width of the first opening in a second direction perpendicular to the first direction is smaller than a space between the adjacent two metal wirings in the second direction.

In accordance with another aspect of the present disclosure, in a method for manufacturing a semiconductor device, a first dielectric layer is formed over a substrate. First recesses are formed in the first dielectric layer. Metal wirings are formed in the first recesses. The metal wirings extend in a first direction. A first insulating layer is formed over the metal wirings and the first dielectric layer. A first mask pattern is formed over the first insulating layer. The first mask pattern includes a first opening extending in the first direction and having a width in a second direction perpendicular to the first direction. The width of the first opening is reduced, thereby forming a second mask pattern having a second opening with a smaller width than the first opening. The first insulating layer is patterned by using the second mask as an etching mask, thereby forming a third opening in the first insulating layer corresponding to the second opening. A first groove corresponding to the third opening is formed between adjacent two metal wirings by etching the first dielectric layer through the third opening. A second dielectric layer is formed so that a first air gap is formed in the first groove. A width of the third opening in the second direction is smaller than a space between the adjacent two metal wirings in the second direction.

In accordance with another aspect of the present disclosure, a semiconductor device includes a first dielectric layer disposed over a substrate, metal wirings, a second dielectric layer, an insulating layer and an air gap. The metal wirings are embedded in the first dielectric layer, and extend in a first direction. The second dielectric layer is disposed over the first dielectric layer and the metal wirings. The insulating layer is disposed between the first dielectric layer and the second dielectric layer. The air gap is formed between adjacent two metal wirings. Upper surfaces of the adjacent two metal wirings are fully covered by the first insulating layer and are not in contact with the second dielectric layer. The first insulating layer overhangs a space between adjacent two metal wirings.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
a first dielectric layer disposed over a substrate;
metal wirings embedded in the first dielectric layer, the metal wirings extending in a first direction;
a second dielectric layer disposed over the first dielectric layer and the metal wirings;
an insulating layer disposed between the first dielectric layer and the second dielectric layer; and
an air gap formed between adjacent two metal wirings, wherein:
in a plan view, the insulating layer includes a slit under which the air gap is disposed, the slit has a width smaller than a space between the adjacent two metal wirings in a second direction crossing the first direction, and upper surfaces of the adjacent two metal wirings are fully covered by the insulating layer.

2. The semiconductor device of claim 1, wherein the upper surfaces of the adjacent two metal wirings are not in contact with the second dielectric layer.

3. The semiconductor device of claim 2, wherein the first insulating layer overhangs a space between the adjacent two metal wirings in a cross sectional view.

4. The semiconductor device of claim 3, wherein an amount of overhang is in a range from 0.5 nm to 2 nm.

5. The semiconductor device of claim 3, wherein:
a groove is formed in the space between the adjacent two metal wirings,
the second dielectric layer includes a first etch-stop layer, a cap layer and an interlayer dielectric layer,
the first etch-stop layer is conformally formed in the groove, and
the cap layer is conformally formed on the first etch-stop layer, thereby defining at least a side and a bottom of the air gap.

6. The semiconductor device of claim 5, wherein a part of the cap layer in the groove is not covered by the interlayer dielectric layer.

7. The semiconductor device of claim 1, wherein the insulating layer is made of at least one selected from the group consisting of SiN, SiCO, SiCN and SiCON.

8. The semiconductor device of claim 6, wherein a thickness of the insulating layer in a range of 1 nm to 30 nm.

9. A semiconductor device, comprising:
a first dielectric layer disposed over a substrate;
metal wirings embedded in the first dielectric layer, the metal wirings including a first metal wiring, a second metal wiring and a third metal wiring, all extending in a first direction and arranged in a second direction perpendicular to the first direction;
a second dielectric layer disposed over the first dielectric layer and the metal wirings;
an insulating layer disposed between the first dielectric layer and the second dielectric layer; and
a first air gap formed between the first metal wiring and the second metal wiring and a second air gap formed between the second metal wiring and the third metal wiring, wherein:
in a plan view, the insulating layer includes a first slit under which the first air gap is disposed and a second slit under which the second sir gap is disposed,
the first and second slits have a width smaller than a space between adjacent two metal wirings in a second direction crossing the first direction, and
upper surfaces of the first to third metal wirings are fully covered by the first insulating layer.

10. The semiconductor device of claim 9, wherein the upper surfaces of the first to third metal wirings are not in contact with the second dielectric layer.

11. The semiconductor device of claim 9, wherein:
a first groove is formed in the space between the first and second metal wirings, and a second groove is formed in the space between the second and third metal wirings,
the second dielectric layer includes a first etch-stop layer, a cap layer and an interlayer dielectric layer,
the first etch-stop layer is conformally formed in the first and second grooves,
the cap layer is conformally formed on the first etch-stop layer, and
a part of the cap layer in the first groove is not covered by the interlayer dielectric layer.

12. The semiconductor device of claim 11, wherein the first insulating layer overhangs a space between adjacent two metal wirings in a cross sectional view.

13. The semiconductor device of claim 12, wherein an amount of overhang is in a range from 0.5 nm to 2 nm.

14. The semiconductor device of claim 9, wherein the insulating layer is made of at least one selected from the group consisting of SiN, SiCO, SiCN and SiCON.

15. The semiconductor device of claim 14, wherein a thickness of the insulating layer in a range of 1 nm to 30 nm.

16. The semiconductor device of claim 9, wherein a location of the first slit in the first direction is different from a location of the second slit in plan view.

17. A semiconductor device, comprising:
a first dielectric layer disposed over a substrate;
metal wirings embedded in the first dielectric layer, the metal wirings including a first metal wiring, a second metal wiring and a third metal wiring, all extending in a first direction and arranged in a second direction perpendicular to the first direction;
a second dielectric layer disposed over the first dielectric layer and the metal wirings;
an insulating layer disposed between the first dielectric layer and the second dielectric layer; and
a first air gap formed between the first metal wiring and the second metal wiring and a second air gap formed between the second metal wiring and the third metal wiring, wherein:
parts of upper surface of the first and second metal wirings are covered by the insulating layer, and
an upper surface of the second metal wiring has a region not covered by the insulating layer.

18. The semiconductor device of claim 17, wherein:
a first groove is formed in the space between the first and second metal wirings, a second groove is formed in the space between the second and third metal wirings,
the second dielectric layer includes a first etch-stop layer, a cap layer and an interlayer dielectric layer,
the first etch-stop layer is conformally formed in the first and second grooves,
the cap layer is conformally formed on the first etch-stop layer, and
the cap layer in the first groove is covered by the interlayer dielectric layer.

19. The semiconductor device of claim 18, wherein the first etch-stop layer is in contact with the upper surface of the second metal wiring.

20. The semiconductor device of claim 18, wherein the upper surfaces of the first and third metal wirings has a step.

* * * * *